United States Patent
Chen et al.

[11] Patent Number: 5,646,074
[45] Date of Patent: Jul. 8, 1997

[54] METHOD OF FORMING GATE OXIDE FOR FIELD EFFECT TRANSISTOR

[75] Inventors: Rickey Chen; Rex Chen, both of Hsinchu, Taiwan

[73] Assignee: Mosel Vitelic, Inc., Taiwan

[21] Appl. No.: 573,960

[22] Filed: Dec. 15, 1995

[51] Int. Cl.[6] .................................................. H01L 21/02
[52] U.S. Cl. .......................... 437/239; 437/244; 437/247; 437/946; 437/983; 148/DIG. 117; 148/DIG. 118
[58] Field of Search ............................ 437/239, 244, 437/247, 946, 983; 148/DIG. 117, DIG. 118

[56] References Cited

U.S. PATENT DOCUMENTS

| | | | |
|---|---|---|---|
| 4,912,062 | 3/1990 | Verma | 437/239 |
| 5,210,056 | 5/1993 | Pong et al. | 437/239 |
| 5,229,334 | 7/1993 | Kato | 437/239 |
| 5,244,843 | 9/1993 | Chau et al. | 437/239 |
| 5,330,935 | 7/1994 | Dobruzinski et al. | 437/239 |
| 5,470,611 | 11/1995 | Yang et al. | 437/239 |
| 5,502,009 | 3/1996 | Lin | 437/239 |
| 5,506,178 | 4/1996 | Suzuki et al. | 437/239 |

*Primary Examiner*—John Niebling
*Assistant Examiner*—Long Pham
*Attorney, Agent, or Firm*—Brumbaugh, Graves, Donohue & Raymond

[57] ABSTRACT

Disclosed is a process for manufacturing a gate oxide of a MOSFET. Since the performance of the gate oxide is deteriorated in photo resist removing, DI healing and high temperature annealing are introduced to recover the gate oxide. A process for manufacturing the gate oxide of the MOSFET on a wafer, includes the steps of: pre-cleaning the wafer, forming gate oxide layer, coating a photo resist, exposing the photo resist, developing the photo resist, implanting ions over the developed photo resist, removing the photo resist, post-cleaning the gate oxide for the purpose of good attachment of a gate polysilicon layer, DI healing the gate oxide, and annealing the gate oxide at a high temperature. As a result, the pass rates for Ebd and Qbd tests of the gate oxide increase.

5 Claims, 2 Drawing Sheets

METHOD OF FORMING GATE OXIDE FOR FIELD EFFECT TRANSISTOR

FIELD OF THE INVENTION

The present invention relates to a process for manufacturing a metal-oxide-semiconductor field effect transistor (MOSFET), especially to a process for manufacturing a gate oxide of the MOSFET.

BACKGROUND OF THE INVENTION

Along with the progress of industry of semiconductor field, the feature size of the MOSFET scales down. The result is that more and more devices can be integrated into a same area on a silicon chip, therefore the performance of an integrated circuit is improved and its field of utilization is enlarged.

According to the scaling rule, as the feature size goes down, the thickness of the gate oxide film of the MOSFET decreases. However, dielectric breakdown may be induced by thin gate oxide, which deteriorates the reliability of MOSFET devices.

Conventional process of manufacturing gate oxide of the MOSFET includes the following steps:

First of all, wafers are put into a processing with machine for proceeding the subsequent oxidation procedure, then a gate oxide region pre-cleanning step is performed to get a good oxide interface characteristic. Therefore, gate oxidation could be subsequently performed to form a thin gate oxide film in the approximate range of 100~120 Å, that could be achieved by letting the wafers be surrounded by wet oxygen ($O_2$) ambient, and then the following steps are photo resist coating, exposure and development.

After that, a couple times of ion implantation steps are performed, and the subsequent step is photo resist removing. Then a gate oxide post-clean step could be carried out (e.g. SPM clean) for the purpose of good attachment of a gate polysilicon layer in the subsequent step. After the deposition of the gate polysilicon layer, a $POCl_3$ gas diffusion procedure is carried out for doping the N type (i.e. Phosphorus) ions into the specific region of device, then a deglazing step is performed to remove the surface silicon glass of device, in order to get good attachment of the following coated photoresist. Therefore, the following steps are gate photoresist coating, exposure and development.

Finally, after the gate etching step, two main electrical characteristic tests, (i.e. Ebd and Qbd test) could be performed.

In the conventional process of manufacturing 16M dynamically random access memory (DRAM), there are three times of coating and removing of photo resist, and three times of ion implantation steps are performed to adjust Vtn1, Vtn2, and Vtp. As shown in Table I and Table II, each kind of chemical cleaning step for removing photo resist, including APM, HPM, CDI, SPM, HDI will all deteriorate the performance of the gate oxide since the breakdown voltage of the gate oxide is reduced, and Ebd will shift from C mode to low voltage, therefore the yield of product is low.

TABLE I

Ebd and Qbd data of each test condition

| Lot ID | Wafer ID | Condition | Ebd Pass Rate (%) >8 MV/cm | Qbd Pass Rate (%) >1 Coul/$cm^2$ |
|---|---|---|---|---|
| LD30092 | 1 | 1. Gox120 Å/APM | 11.54% | 7.69% |
| LD30092 | 2 | 2. Gox120 Å/HPM | 17.86% | 17.86% |
| LD30092 | 3 | 3. Gox120 Å/CDI | 0.00% | 0.00% |
| LD30092 | 4 | 4. Gox120 Å/SPM | 0.00% | 0.00% |
| LD30092 | 5 | 5. Gox120 Å/HDI | 0.00% | 0.00% |
| LD30091 | 16 | 6. Gox120 Å | 96.3% | 88.89% |

The data listed in table I could further correspond to the result shown in FIG. 1, which clarify the Ebd and Qbd test results processed by using the conventional gate oxidation procedure. It indicates that the gate oxide was deteriorated by APM, HPM, SPM and hot or cold DI rinse on oxide surface from Ebd and Qbd result.

TABLE II

Qbd result

| Lot ID | Wafer ID | Condition | >1 Coul/$cm^2$ | >10 Coul/$cm^2$ | >15 Coul/$cm^2$ | Average (Coul/$cm^2$) |
|---|---|---|---|---|---|---|
| LD30092 | 1 | 1. Gox120 Å/APM | 6.7% | 0.0% | 0.0% | 0.400 |
| LD30092 | 2 | 2. Gox120 Å/HPM | 40% | 13.2% | 6.7% | 3.200 |
| LD30092 | 3 | 3. Gox120 Å/CDI | 0.0% | 0.0% | 0.0% | 0.001 |
| LD30092 | 4 | 4. Gox120 Å/SPM | 0.0% | 0.0% | 0.0% | 0.001 |
| LD30092 | 5 | 5. Gox120 Å/HDI | 0.0% | 0.0% | 0.0% | 0.001 |
| LD30091 | 16 | 6. Gox120 Å | 76.7% | 60.0% | 50.5% | 13.400 |

The data shown in TABLE II indicate that gate oxide deteriorates by chemical cleaning. DI water rinse can even deteriorate charge to breakdown of gate oxide to 0%. However, HPM clean shows less degraded effect.

BRIEF DESCRIPTION OF THE DRAWING

The present invention will be more fully understood from the detailed description given hereinafter with reference to the accompanying drawings which are given by way of illustration only, and thus are not limitative of the present invention and wherein.

SUMMARY OF THE INVENTION

Figure 1:
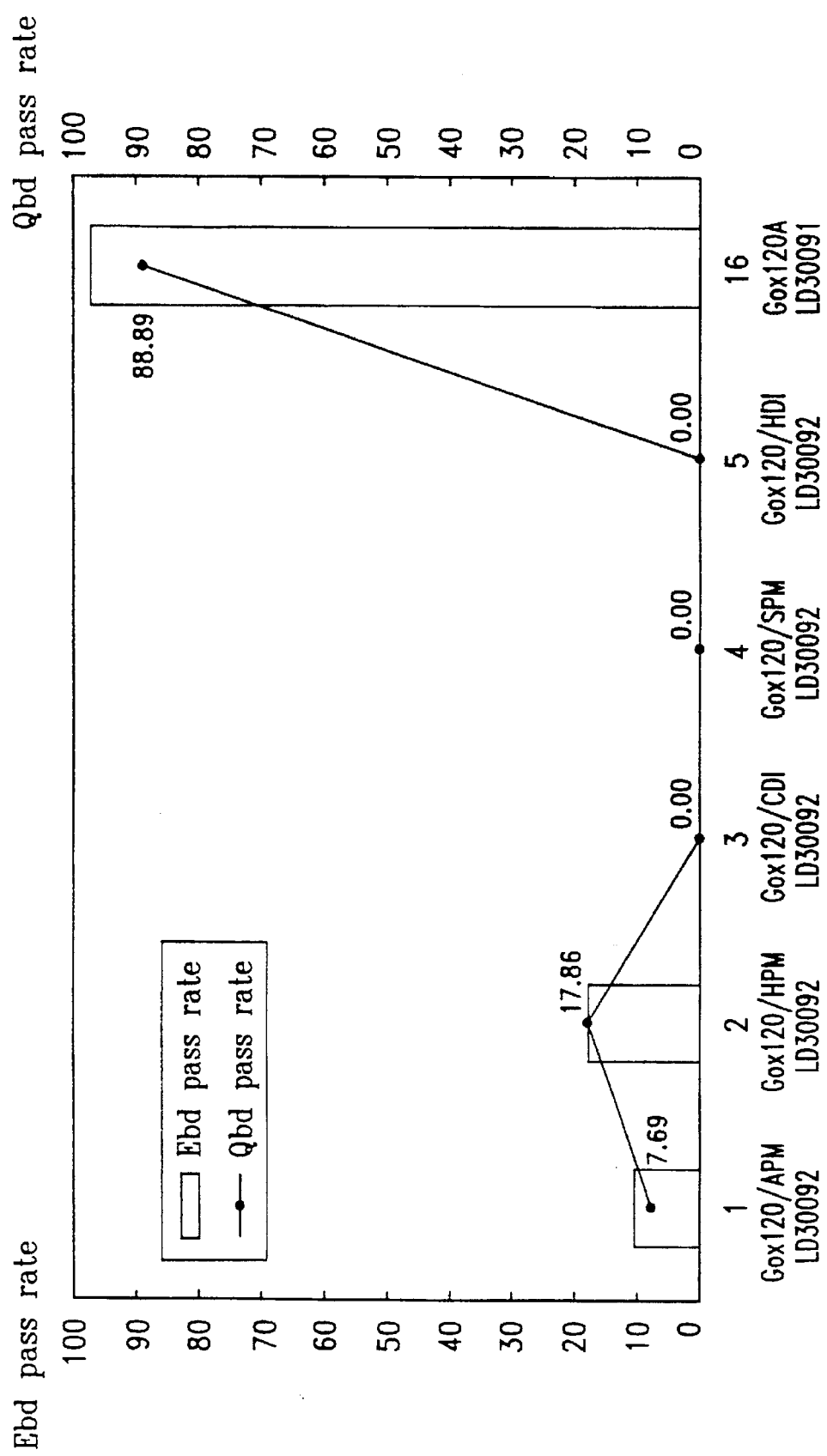
FIG. 1 shows the results of Qbd and Ebd tests for the gate oxide of device manufactured by conventional process.
Figure 2:
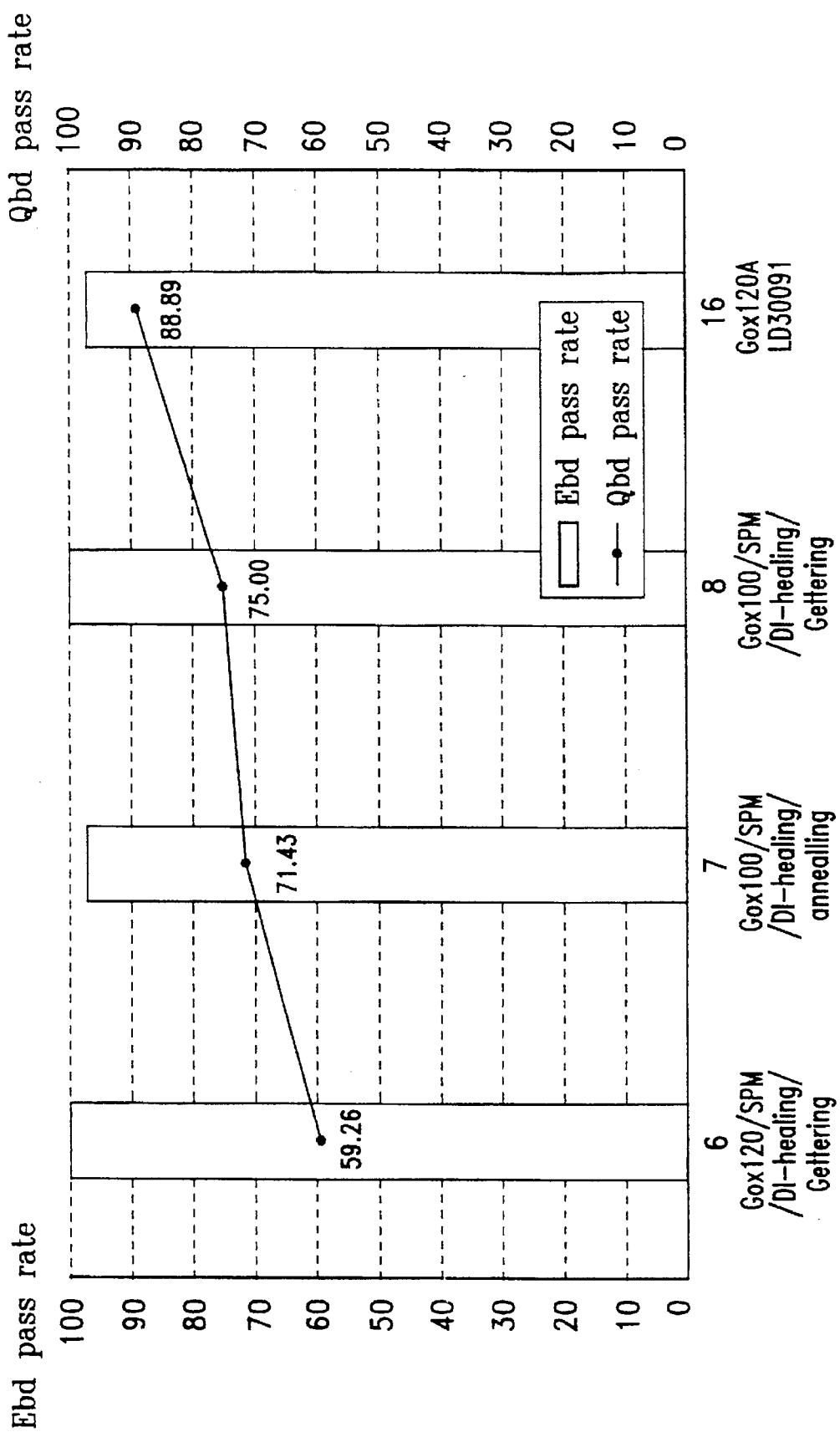
FIG. 2 shows the results of Qbd and Ebd tests for the gate oxide of device manufactured according to the present invention disclosure.

It is therefore an object of the present invention to provide a process for manufacturing a gate oxide of a MOSFET, to reduce the deterioration of gate oxide during the chemical cleaning step for removing photo resist, so as to improve Qbd and Ebd, therefore increasing the yield of product.

The object of the present invention is fulfilled by providing a process for manufacturing the gate oxide of the MOSFET on a wafer. The process comprises the following steps: pre-cleaning the wafer, used for the purpose of pre-cleaning surface of a gate oxide region of the MOSFET, forming gate oxide layer, coating a photo resist, exposing the photo resist, developing the photo resist, implanting ions, used for the purpose of adjusting electrical parameter of the MOSFET, removing the photo resist, post-cleaning the gate oxide layer, used for the purpose of good attachment of a gate polysilicon layer, DI healing the gate oxide layer, and annealing the gate oxide at high temperature.

DETAILED DESCRIPTION OF THE PREFERRED EMBODIMENT

As stated above, in the conventional process of fabricating 16M DRAM, the steps of photo resist coating, removing and ion implantation will all decrease the breakdown voltage of the gate oxide and further lower the yield. For recovering the performance of the gate oxide, the present invention induces DI healing and high temperature annealing into the process after photo resist removing and gate oxide pre-clean. The process according to the present invention includes the following steps:

First of all, wafers are put into the processing machine for proceeding the subsequent oxidation procedure, then a gate oxide region pre-cleanning step is performed to get a good oxide interface characteristic. Therefore, gate oxidation could be subsequently performed to form a thin gate oxide film in the approximate range of 100~120 Å, that could be achieved by letting the wafers be surrounded by wet oxygen ($O_2$) ambient, and then the following steps are photo resist coating, exposure and development.

After that, a couple times of ion implantation steps are performed, and the subsequent step is photo resist removing. Then the gate oxide post-clean step could be carried out (e.g. SPM clean) for the purpose of good attachment of gate polysilicon layer in the subsequent step. Following this, a DI healing step is performed, and then high temperature annealing step is adopted. The next step is polysilicon deposition. After the deposition of gate polysilicon layer, a $POCl_3$ gas diffusion procedure is carried out for doping the N type (i.e. Phosphorus) ions into the specific region of device, then a deglazing step is performed to remove the surface silicon glass of device, in order to get good attachment of the following coated photoresist. Therefore, the following steps are gate photoresist coating, exposure and development.

Finally, after the gate etching step, two main electrical characteristic tests, i.e. Ebd and Qbd test could also be performed as described in the foregoing.

In the process described above, the DI healing step is performed by spinning wafer on a spin scrubber. DI water is poured onto the wafer. A brush is used to scrub on the wafer. Due to charging effect, the Ebd and Qbd of the gate oxide increases.

In the high temperature annealing step, wafer is annealed in a high temperature furnace to improve $Si-SiO_2$ interface state and reduce oxide charge, which raises Ebd and Qbd of gate oxide and increases the yield of product.

The condition of high temperature annealing includes:

| Load | $N_2$ | 6 LPM | |
| Temp Stable | $N_2$ | 6 LPM | 10' |
| Anneal | $O_2$ | 6 LPM | 30' |
| Unload | $N_2$ | 6 LPM | |

The temperature is controlled at 800 °C. Besides, the problem of gas leakage of the furnace can be avoid if $O_2$ is used instead of Trans LC, and the LPM used in the above represents for liter per minute.

The performance of metal-oxide-semiconductor capacitors produced according to the process of the present invention is shown in Table III.

TABLE III

The data of improvement of Ebd and Qbd of gate oxide

| Lot ID | Condition | Wafer ID | Ebd Pass Rate (%) >8 MV/cm | Qbd Pass Rate (%) >1 Coul/cm$^2$ |
| --- | --- | --- | --- | --- |
| LD30092 | Gox120 Å/SPM/DI-healing/Gettering | 6 | 100.00 | 59.26 |
| LD30092 | Gox120 Å/SPM/DI-healing/annealing | 7 | 96.43 | 71.43 |
| LD30092 | Gox120 Å/SPM/DI-healing/Gettering | 8 | 100.00 | 75.00 |
| LD30091 | Gox120 Å | 16 | 96.3 | 88.89 |

TABLE III shows Ebd and Qbd data for wafer process with DI healing and high temperature treatment after gate oxide growth and cleaned with SPM solution.

Comparing Table III and Table I, it is easily concluded that the performance of gate oxide is greatly improved after DI healing and high temperature annealing. Ebd and Qbd is increased and therefore the yield of product can be raised.

While the invention has been described by way of examples and in terms of several preferred embodiments, it is to be understood that the invention need not be limited to the disclosed embodiment. On the contrary, it is intended to cover various modifications and similar arrangements included within the spirit and scope of the appended claims, the scope of which should be accorded the broadest interpretation so as to encompass all such modifications and similar structures.

What is claimed is:

1. A process for manufacturing a gate oxide of a MOSFET on a wafer, comprising the steps of:

pre-cleaning the wafer to clean a surface of a gate oxide region of the MOSFET;

forming a gate oxide layer on the wafer; coating a photo resist;

exposing a portion of the photo resist by a photolithography process;

developing the photo resist;

implanting ions over the developed photo resist;

removing the photo resist;

post-cleaning the gate oxide layer, wherein the post-cleaning provides good attachment of a gate polysilicon layer, healing the gate oxide layer by pouring DI water over the gate oxide layer; and annealing the gate oxide layer.

2. A process for manufacturing the gate oxide of the MOSFET on the wafer as in claim 1, wherein the gate oxide layer is annealed in presence of $O_2$, at a temperature in the approximate range of 800° C.

3. A process for manufacturing the gate oxide of the MOSFET on the wafer as in claim 1, wherein the gate oxide layer is formed on the wafer by exposing the wafer to wet $O_2$ ambient.

4. A process for manufacturing the gate oxide of the MOSFET on the wafer as in claim 1, wherein the gate oxide layer has a thickness in the approximate range of 100–120 Å.

5. A process for manufacturing the gate oxide of the MOSFET on the wafer as in claim 1, wherein said gate oxide layer healing step is performed by spinning the wafer on a spin scrubber.

* * * * *